(12) United States Patent
Haskett et al.

(10) Patent No.: US 7,476,961 B2
(45) Date of Patent: Jan. 13, 2009

(54) METHOD AND APPARATUS FOR FORMING A DMD WINDOW FRAME WITH MOLDED GLASS

(75) Inventors: Bradley M. Haskett, Allen, TX (US); John Patrick O'Connor, Ft. Worth, TX (US); Jwei Wien Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 178 days.

(21) Appl. No.: 11/623,482

(22) Filed: Jan. 16, 2007

(65) Prior Publication Data

US 2007/0110947 A1 May 17, 2007

Related U.S. Application Data

(62) Division of application No. 10/200,684, filed on Jul. 22, 2002, now Pat. No. 7,163,838.

(51) Int. Cl.
*H01L 23/02* (2006.01)
(52) U.S. Cl. ............... 257/680; 257/704; 257/E21.499; 257/E23.193
(58) Field of Classification Search ................. 257/680, 257/704, E21.499, E23.193
See application file for complete search history.

(56) References Cited

U.S. PATENT DOCUMENTS

| | | | | |
|---|---|---|---|---|
| 5,034,800 A * | 7/1991 | Marchisi | ..................... | 257/695 |
| 5,936,758 A | 8/1999 | Fisher et al. | | |
| 6,072,232 A * | 6/2000 | Li et al. | ....................... | 257/680 |
| 6,191,359 B1 | 2/2001 | Sengupta et al. | | |
| 6,323,982 B1 | 11/2001 | Hornbeck | | |
| 6,398,379 B1 * | 6/2002 | Imai | ............................ | 362/24 |
| 6,489,178 B2 | 12/2002 | Coyle et al. | | |
| 6,639,313 B1 * | 10/2003 | Martin et al. | ............... | 257/704 |
| 6,827,449 B1 | 12/2004 | Klonis et al. | | |
| 6,894,853 B2 | 5/2005 | Haskett et al. | | |
| 7,026,710 B2 | 4/2006 | Coyle et al. | | |
| 2001/0041381 A1 | 11/2001 | Choi | | |
| 2002/0034026 A1 * | 3/2002 | Orcutt et al. | ................ | 359/877 |
| 2002/0192403 A1 | 12/2002 | Hanna | | |
| 2003/0101562 A1 | 6/2003 | Hanna et al. | | |

* cited by examiner

*Primary Examiner*—Trung Dang
(74) *Attorney, Agent, or Firm*—Wade J. Brady, III; Frederick J. Telecky, Jr.

(57) ABSTRACT

An improved method for fabricating a window frame/window piece assembly is disclosed in this application. A window frame having an opening in its inner portion is provided. According to one aspect, the window frame can be formed from a unitary piece of sheet metal. A transparent piece is attached to the inner portion of the window frame through a molding process. According to one embodiment, the window frame is placed within a mold such that the inner portion of the window frame projects into an inner cavity inside the mold. After the mold has been closed, a transparent material is injected into the inner cavity so that it bonds with the inner portion of the window frame. After the bond of between the transparent material and the window frame is set, the window frame/window piece assembly is removed from the mold. According to another embodiment, a plurality of window frames may be loaded into a single mold so that a plurality of window frame/window piece assemblies can be fabricated in a single batch.

18 Claims, 6 Drawing Sheets

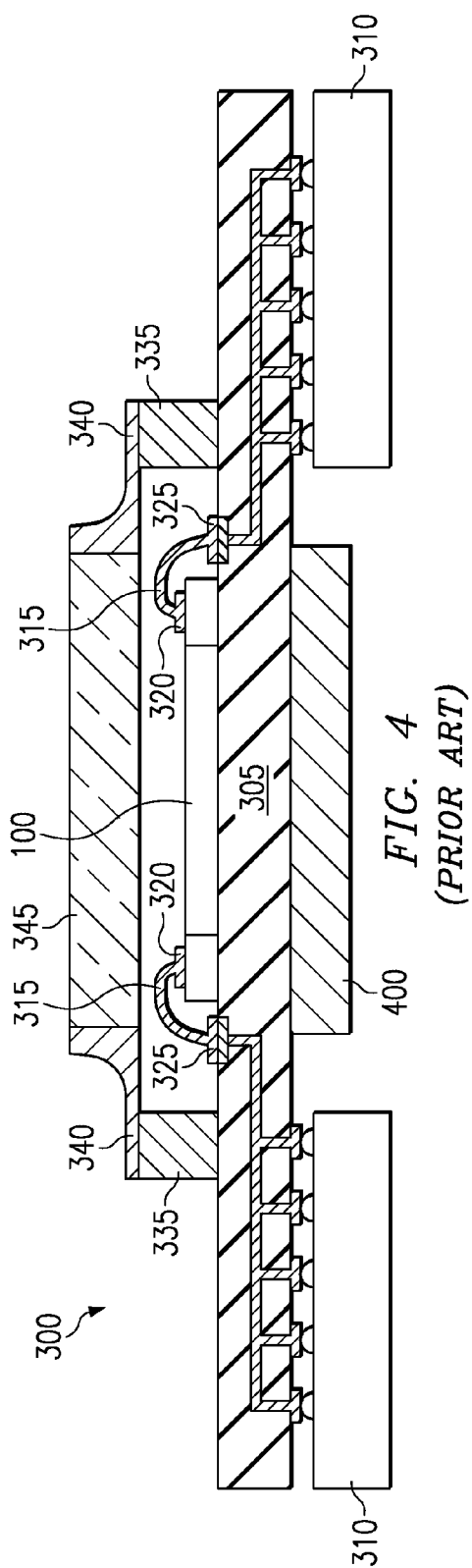
FIG. 4
(PRIOR ART)
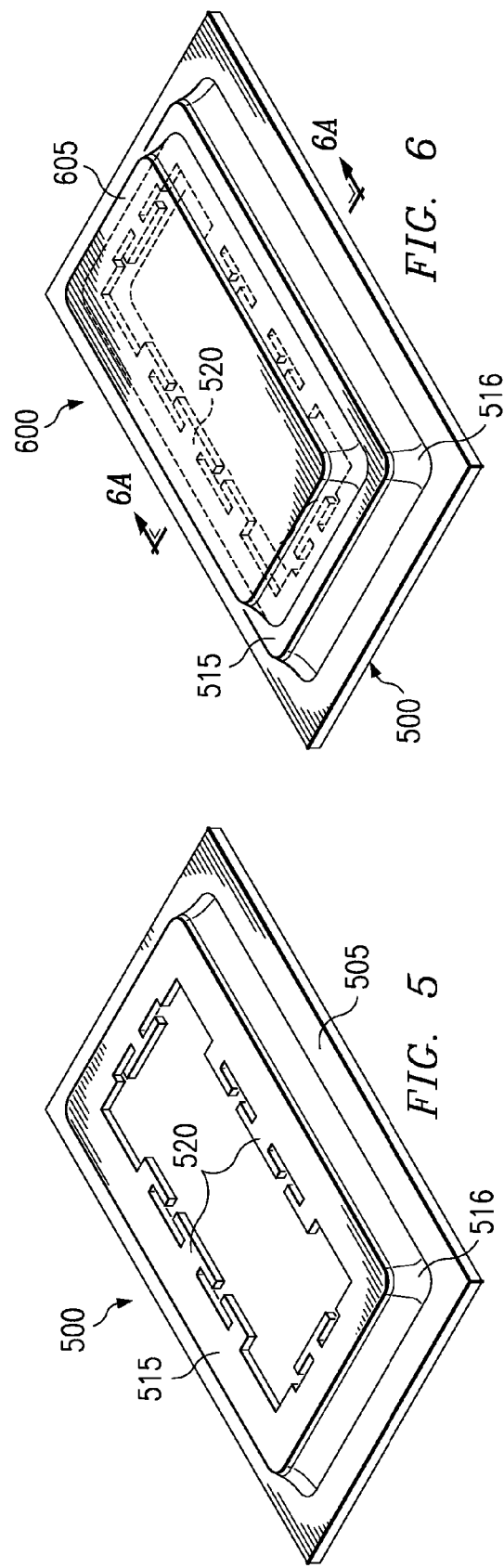
FIG. 5
FIG. 6

METHOD AND APPARATUS FOR FORMING A DMD WINDOW FRAME WITH MOLDED GLASS

This application is a divisional of application Ser. No. 10/200,684, filed Jul. 22, 2002, now U.S. Pat. No. 7,163,883.

BACKGROUND

Micromechanical devices are small structures typically fabricated on a semiconductor wafer using techniques such as optical lithography, doping, metal sputtering, oxide deposition, and plasma etching similar to those developed for the fabrication of integrated circuits. Digital micromirror devices (DMDs), sometimes referred to as deformable micromirror devices, are a type of micromechanical device. Other types of micromechanical devices include accelerometers, pressure and flow sensors, gears and motors.

Digital micromirror devices have been utilized in optical display systems. In these display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of many digital full-color image projection systems.

Micromirrors have evolved rapidly over the past ten to fifteen years. Early devices used a deformable reflective membrane that, when electrostatically attracted to an underlying address electrode, dimpled toward the address electrode. Schieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Thin hinge structures, which restrict the deformation to a relatively small region of the device, limit the amount of light scattered and improve image quality.

Torsion beam devices enabled the use of dark field optical systems. Torsion beam devices use a thin metal layer to form a torsion beam, which is referred to as a hinge, and a thicker metal layer to form a rigid member, or beam, typically having a mirror-like surface. The rigid member or mirror is suspended by, and typically centered on, the torsion hinge—allowing the mirror to rotate by twisting the torsion hinge. Address electrodes are formed on the substrate beneath the mirror on either side of the torsion hinge axis. Electrostatic attraction between an address electrode and the mirror, which in effect form the two plates of an air gap capacitor, is used to rotate the mirror about the longitudinal axis of the hinge.

Recent micromirror configurations, called hidden-hinge designs, further improve the image contrast ratio by using an elevated mirror to block most of the light from reaching the torsion beam hinges. The elevated mirror is connected to an underlying torsion beam or yoke by a support post. The yoke is attached to the torsion hinges, which in turn are connected to rigid support posts. Because the structures that support the mirror and allow it to rotate are underneath the mirror instead of around the perimeter of the mirror, virtually the entire surface of the device is used to fabricate the mirror. Since virtually all of the light incident on a hidden-hinge micromirror device reaches an active mirror surface—and is thus either used to form an image pixel or is reflected away from the image to a light trap—the hidden-hinge device's contrast ratio is much higher than the contrast ratio of previous devices.

Images are created by positioning the DMD so that a light beam strikes the DMD at an angle equal to twice the angle of rotation. In this position, the mirrors fully rotated toward the light source reflect light in a direction normal to the surface of the micromirror device and into the aperture of a projection lens—transmitting light to a pixel on the image plane. Mirrors rotated away from the light source reflect light away from the projection lens—leaving the corresponding pixel dark.

Full-color images are generated either by using three micromirror devices to produce three single-color images, or by sequentially forming three single-color images using a single micromirror device illuminated by a beam of light passing through three color filters mounted on a rotating color wheel.

An example of a small portion of a digital micromirror array is depicted in FIG. 1. In FIG. 1, a small portion of a digital micromirror array 100 with several mirrors 102 is depicted. Some of the mirrors 102 have been removed to show the underlying structure of the DMD array. FIG. 2 is an exploded close-up of one individual mirror 102 of a DMD array. The electrical interconnections and operations of the individual micromirrors 102 are described in further detail in U.S. Pat. No. 6,323,982 entitled Yield Superstructure for Digital Micromirror Device to Larry J. Hornbeck, which is hereby incorporated by reference.

A representative example of an existing spatial light modulator (SLM) device 300 is depicted in FIG. 3. In FIG. 3, a micromirror array 100 is mounted onto a ceramic base 305, which is further mounted onto a printed circuit board (PCB) or electronic lead package 310. The micromirror array 100 is electrically connected to the ceramic base 305 by a series of leads 315. Each of the leads 315 is connected to the micromirror array 100 at bonding pads 320 that are integral to the micromirror array 100. At the other end, the leads 315 are connected to bonding pads 325, which are integral to the ceramic base 305. Each of the bonding pads 325 on the ceramic base 305 is connected to a series of land grid array (LGA) pads on the bottom of the ceramic base 305 through internal interconnect layers that are built into the ceramic base. The LGA-type pads may then be connected to the PCB 310 via elastomer or C-spring connectors. In order to ensure a reliable electrical connection between the ceramic base 305 and the PCB 310, a mechanical loading must be applied between the ceramic base 305 and the PCB 310. FIG. 3 describes only one representative embodiment for electrically connecting the micromirror array 100. Other suitable arrangements for electrically connecting the micromirror array 100 are well known in the art.

The micromirror array 100 depicted in FIG. 3 is hermetically sealed in the SLM device 300 to prevent the array 100 from becoming damaged. To accomplish this, a seal ring 335 is disposed on the ceramic base 305 so that the micromirror array 100 is surrounded. A window frame 340, which incorporates an optically transparent piece 345, is mounted onto the seal ring 335 to form a seal that encases the micromirror array 100. The window frame 340 comprises a single block of metal or other suitable material that has been formed through forging or CNC machining. The transparent piece 345 is typically a piece of glass or other optically transmissive material that is mounted and sealed into the window frame 340.

The window frame 340 is mounted onto the seal ring 335 by seam welding or other suitable processes that forms a seal between the seal ring 335 and the frame 340.

A cross-sectional view of the SLM device 300 depicted in FIG. 3 along the axis 4-4 is depicted in FIG. 4. Many of the same components described above (the micromirror array 100, the ceramic base 305, the electronic lead package 310, the electronic leads 315, bonding pads 320 and 325, the seal ring 335, the window frame 340, and the transparent piece 345) are depicted in FIG. 4. Also depicted is a heat sink 400 that is mounted onto the bottom of the base 305. The heat sink 400 absorbs the heat generated by the micromirror array 100 when it is illuminated with a light source during its operation. Further details of the components and connections of a typical SLM device are described in U.S. Pat. No. 5,936,758 entitled Method of Passivating a Micromechanical Device Within a Hermetic Package to Edward C. Fisher, et al., which is hereby incorporated by reference.

A problem associated with existing SLM devices 300 arises from the fact that the costs associated with manufacturing the window frame 340 and the transparent piece 345 can be high. This is a result of several factors. At the outset, it should be noted that existing designs for the window frame 340 require a relatively large amount of metal to form the shapes that are depicted in FIGS. 3 and 4. This can add substantial materials costs to the total cost of a SLM device 300. Furthermore, the process of forming the window frame 340 requires CNC machining or forging, which are relatively expensive processes. In addition, because the transparent piece 345 is mounted into the window frame 340 by a fusing process, the transparent piece 345 must be polished after it is mounted in the window frame 340. Moreover, anti-reflective coatings and chrome coatings cannot be applied to the transparent piece before it is mounted to the window frame 340. This means that each of the window frame/transparent piece assemblies must be individually polished and coated with the appropriate layers after the frame mounting process. There is therefore a need in the art for an improved window frame/transparent piece assembly that utilizes fewer raw materials, is less expensive to fabricate, and can be processed in batches so that certain processes, such as materials coatings, can be applied to more than one window frame/transparent piece assembly at a time.

BRIEF SUMMARY

An improved method for fabricating a window frame/window piece assembly is disclosed in this application. A window frame having an opening in its inner portion is provided. According to one aspect, the window frame can be formed from a unitary piece of sheet metal. A transparent piece is attached to the inner portion of the window frame through a molding process. According to one embodiment, the window frame is placed within a mold such that the inner portion of the window frame projects into an inner cavity inside the mold. After the mold has been closed, a transparent material is injected into the inner cavity so that it bonds with the inner portion of the window frame. After the bond between the transparent material and the window frame is set, the window frame/window piece assembly is removed from the mold. According to another embodiment, a plurality of window frames may be loaded into a single mold so that a plurality of window frame/window piece assemblies can be fabricated in a single batch.

BRIEF DESCRIPTION OF THE DRAWINGS

FIG. 4 is a cross-sectional view of a representative embodiment of an existing DMD device assembly.

FIG. 5 is a perspective view of an improved window frame that includes a jigsaw pattern on the inside edge.

FIG. 6 is a perspective view of an improved window frame with a transparent piece (window) molded onto the window frame.

DETAILED DESCRIPTION

Figure 1:
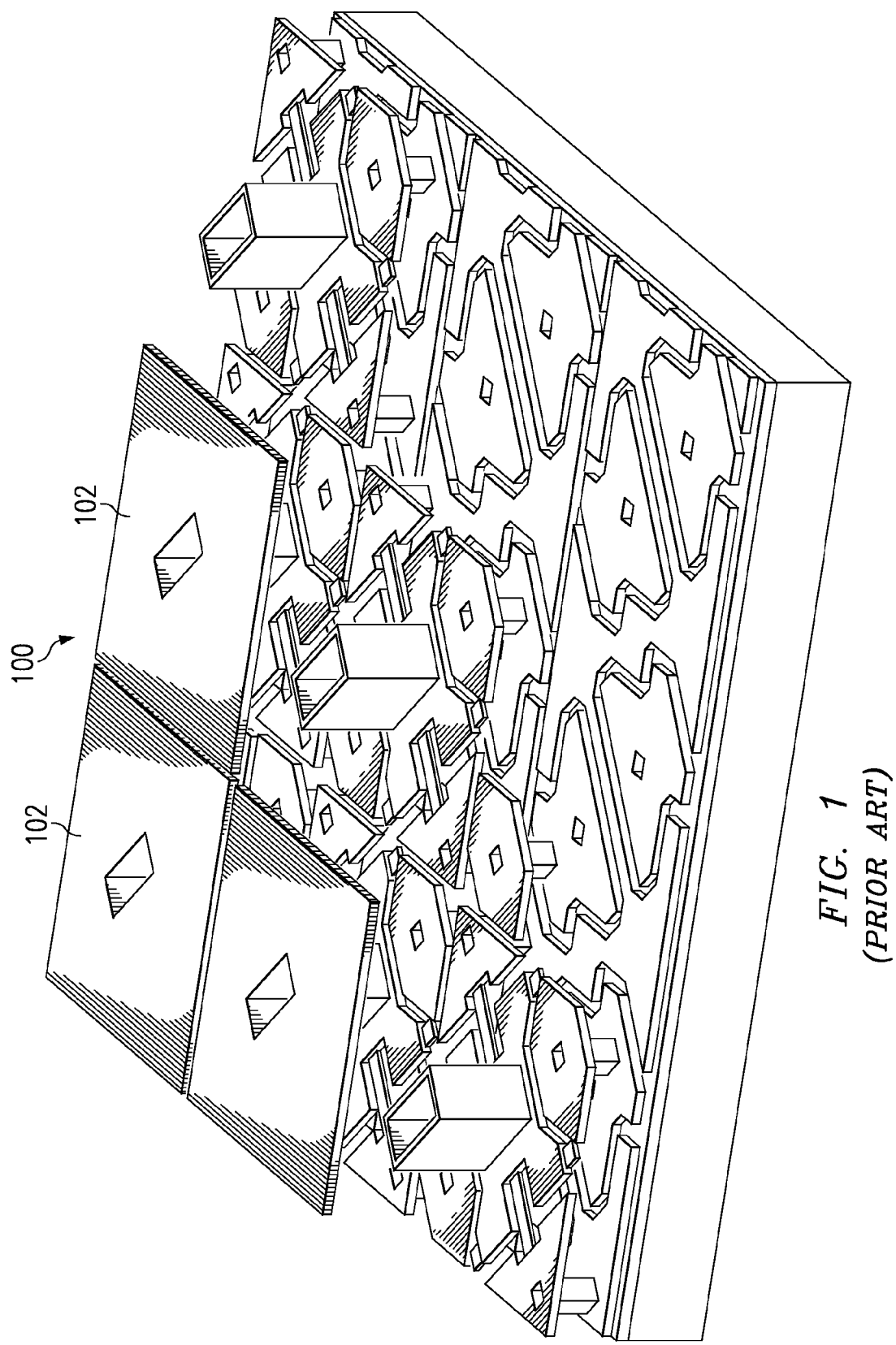
FIG. 1 is a perspective view of a portion of a micromirror array with some of the micromirrors removed.
Figure 3:
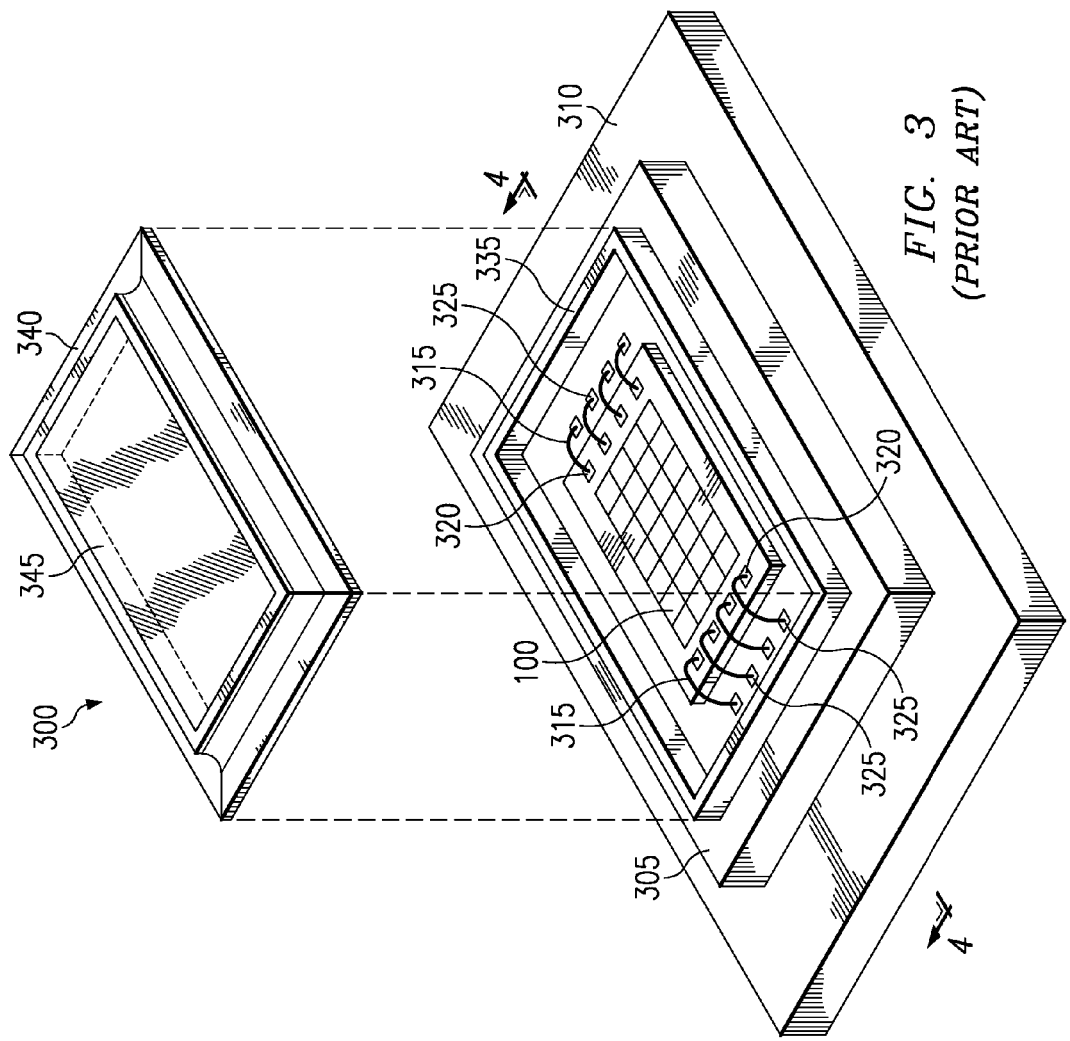
FIG. 3 is a perspective view of a representative embodiment of an existing DMD device assembly.
Figure 2:
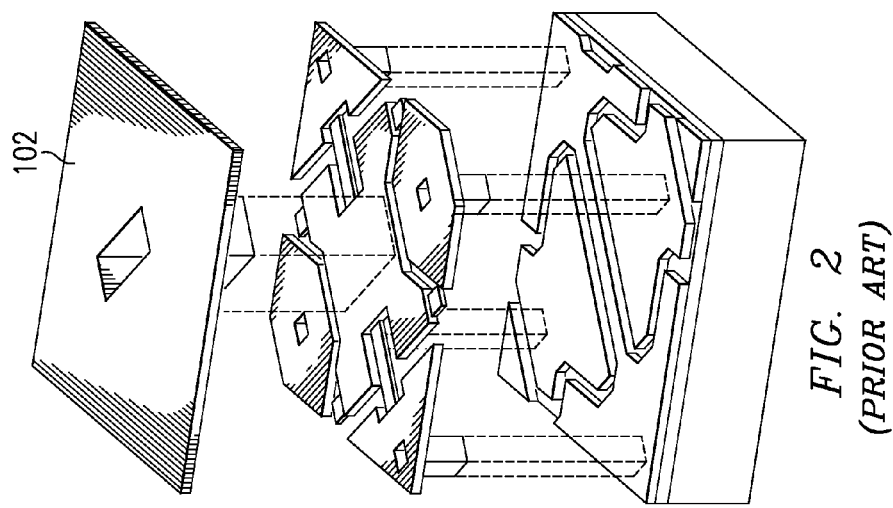
FIG. 2 is an exploded perspective view of a single micromirror assembly.
Figure 6A:
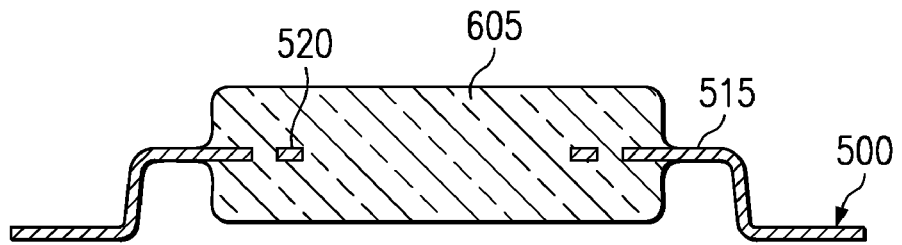
FIG. 6A is a cross-sectional view of an improved window frame with a transparent piece (glass) molded onto the window frame.
Figure 6B:
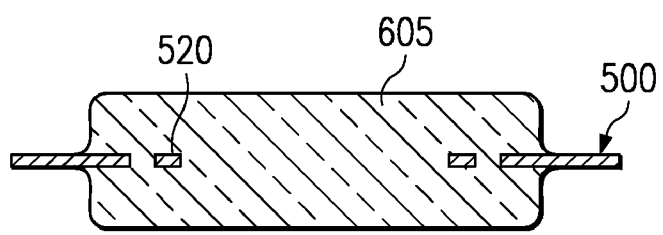
FIG. 6B is a cross-sectional view of another embodiment of an improved window frame with a transparent piece (glass) molded onto the window frame.
Figure 6C:
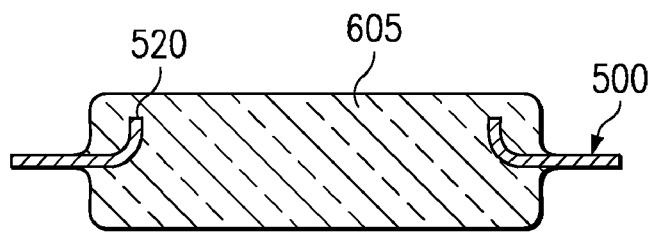
FIG. 6C is a cross-sectional view of another embodiment of an improved window frame with a transparent piece (glass) molded onto the window frame.
Figure 6D:
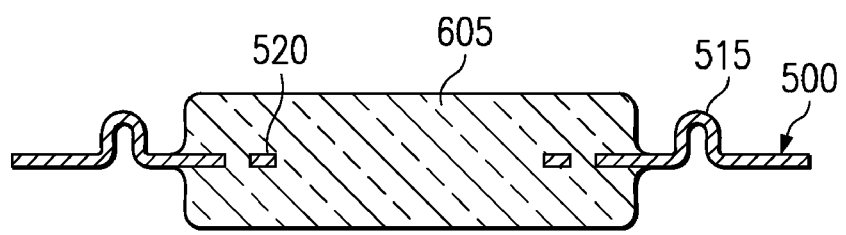
FIG. 6D is a cross-sectional view of another embodiment of an improved window frame with a transparent piece (glass) molded onto the window frame.

An improved method and apparatus for manufacturing a window frame and window piece for use with a spatial light modulator (SLM) is disclosed herein. One embodiment of such an improved window frame 500 is depicted in FIG. 5. In FIG. 5, the window frame 500 is comprised of an outer portion 505, a central portion 510, and an inner portion 515. It is contemplated that the outer portion 505 and the inner portion 515 shall be substantially parallel to each other. Other embodiments may be utilized, however, that do not include parallel inner and outer portions. In addition, the inside edge of the inner portion 515 can include a jigsaw shape 520, which forms a mechanical bond with a window piece to be inserted later. The central portion 510 can be formed in the shape of a step so that the inner portion 515 is at a higher elevation relative to the outer portion 505. It is contemplated that other embodiments may be utilized, such as an embodiment in which the inner and outer portions are co-planar. The window frame 500 depicted in FIG. 5 has several advantages over the window frame depicted in FIGS. 3 and 4. First, the window frame 500 can be formed from a unitary piece of sheet metal that is stamped or otherwise processed into an appropriate shape. Accordingly, the manufacturing and materials costs associated with window frame 500 of FIG. 5 are substantially less than the window frame of FIGS. 3 and 4. Second, if the central portion 510 of the window frame 500 includes a contoured shape such as a step of a "U" shape, then such contours can act to relieve the mechanical stresses applied to the window frame when it is attached to a SLM device. This concept is further described in co-pending U.S. patent application Ser. No. 10/143,232 entitled "Stress Relieved Flat Frame for DMD Window," filed on May 10, 2002 and which is hereby incorporated by reference.

The materials comprising the window frame 500 should be selected so that its coefficient of thermal expansion is substantially similar to the coefficient of thermal expansion for the ceramic base and the coefficient of thermal expansion for the window piece. An alloy of Iron-Nickel-Cobalt compliant with ASTM F-15, Mil-I-23011C, Class 1 (a.k.a. Kovar®) has been found to be an effective alloy for the window frame. Other effective alloys include ASTM F-1684 (96), Mil-I-23011C Class 7 (a.k.a. Invar® 36) and ASTM F-30 Mil-I-23011C Classes 5, 4, 3 and 2 (a.k.a. Alloys 42, 46, 48 and 52, respectively). According to another aspect, the window frame can be stamped from a unitary piece of sheet metal comprised of the Iron-Nickel-Cobalt alloy. According to another aspect, the window frame material will have a surface finish of 32 microinches or better. According to yet another aspect, the window frame material may be plated with gold with a minimum thickness of about 50 microinches over a plating of about 100-300 microinches of electrolytic nickel. The gold coverage can be complete, but unplated areas due to fixturing are permitted along the outer edge of the flange. It is contemplated that the gold plating will not be located at the regions where the glass is bonded to the frame. The nickel plating should conform to AMS-QQ-N-290, class 1, grade G and the gold plating should conform to ASTM-B-488, type 1, grade A.

According to FIG. 6, a transparent piece 605 (i.e. a window piece) can be attached to the window frame 500 to allow it to function as a SLM window frame assembly 600. The transparent piece 605 should be attached to the window frame 500 so that the transparent piece 605 fully encapsulates the jigsaw shape 520 formed along the inside edge of the inner portion 515. In addition, the transparent piece 605 should overlap the jigsaw shape 520 on both the top side of the window frame 500 and the bottom side of the window frame 500. This overlap is further depicted in FIG. 6A, which is a cross section of the SLM window frame assembly taken along axis A-A. In FIG. 6A, the transparent piece 605 is depicted as overlapping the jigsaw shape 520 at the inside edge of the inner portion 515 of the window frame 500. As a result of this overlap, the window frame 500 is mechanically bonded to the transparent piece 605 so as to form a hermetic seal between the two components. Accordingly, when the window frame assembly is mounted to a SLM device, a hermetic seal is formed to protect the underlying DMD array 100. Generally, the window piece/window frame seal should be capable of meeting a helium leak rate of less than $5 \times 10^{-8}$ cc/sec after exposing the window piece/window frame assembly to 15 thermal shocks followed by 100 thermal cycles with −55° C. to 125° C. temperature extremes per MIL-STD-750D methods 1056.7 test condition C and 1051.5 test condition B respectively. Cross-sectional views of several alternative embodiments for the window frame 600 are depicted in FIGS. 6B-6D.

Figure 7A:
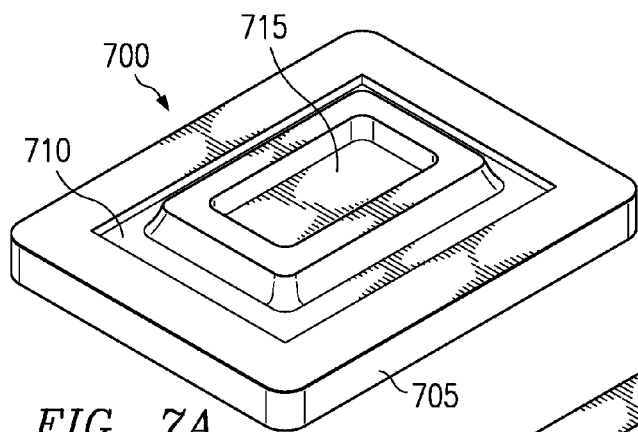
FIG. 7A is a perspective view of an upper mold portion that is designed to receive a window frame.
Figure 7B:
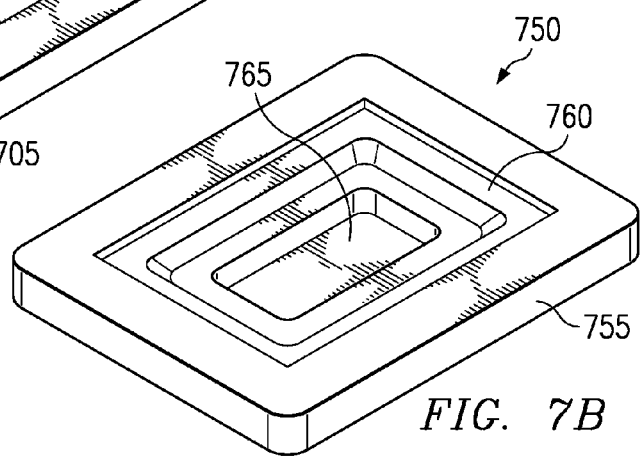
FIG. 7B is a perspective view of a lower mold portion that is designed to receive a window frame.

The SLM window frame assembly 600 can be formed by a molding process whereby the transparent piece 605 is bonded to the window frame 500 while the transparent substance is in an amorphous flowable state. According to one embodiment, the transparent substance may comprise an alkali borosilicate glass. More specifically, Corning brand glass material 7056 has been found to be suitable for use with the disclosed apparatus and method. This can be accomplished by placing the window frame 500 inside of a mold and injecting a transparent substance into the mold. Two portions of a mold suitable for this purpose are depicted in FIGS. 7A & 7B. In FIG. 7A, a first mold portion 700 is depicted as comprising an outer shell 705, a frame cavity portion 710 and an inner cavity portion 715. The dimensions of the frame cavity portion 710 are matched with the dimensions of the window frame 500 so that the window frame may be readily seated within the frame cavity portion 710. In FIG. 7B, a second mold portion 750 is depicted as comprising an outer shell 755, a frame cavity portion 760 and an inner cavity portion 765. Much like the first mold portion, the dimensions of the frame cavity portion 760 are matched with the dimensions of the window frame 500 so that the window frame may be readily seated within the frame cavity portion 760.

Figure 8A:
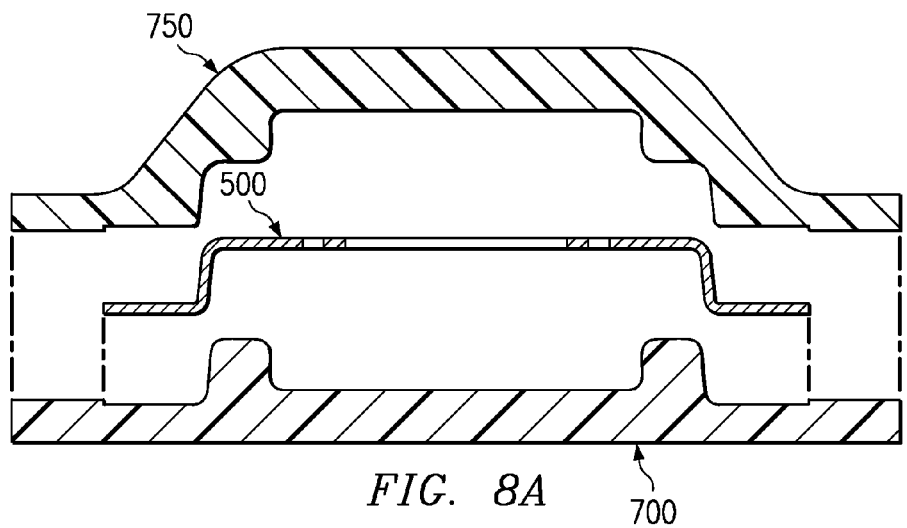
FIGS. 8A and 8B is a cross-sectional view of the upper and lower mold portions and a window frame that is placed between the mold portions.
Figure 8B:
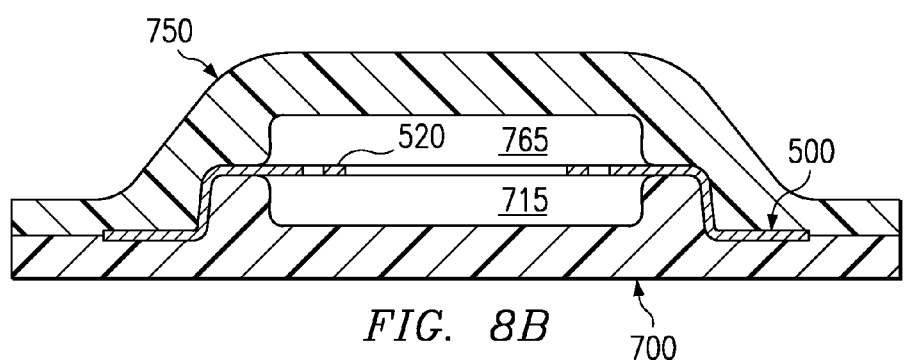

The mating of the first and second mold portions 700 & 750, as well as the seating of the frame portion 500 therein, is depicted in FIGS. 8A & 8B. FIG. 8A is a cross-sectional diagram depicting the mating of the first and second mold portions 700 & 750 with a window frame 500 sandwiched therebetween. As the first and second mold portions 700 & 750 are mated, the window frame 500 is fully enclosed within the mold portions. Furthermore, the jigsaw portion of the window frame 520 projects into the inner cavity portion (715 & 765) within the mold. Accordingly, when the flowing transparent substance is injected into the inner cavity portions of the mold, the transparent substance will encapsulate the jigsaw portion of the window frame 520 so that a mechanical and hermetic bond is formed.

Figure 9:
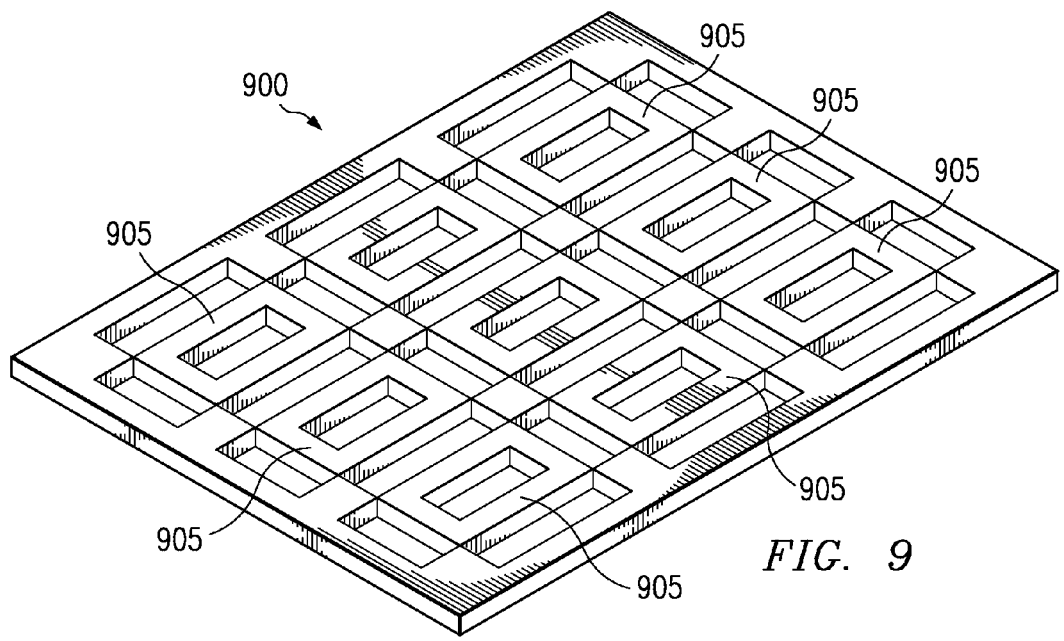
FIG. 9 is a perspective view of a representative set of window frames suitable for batch processing.

One advantage of using a molding process to attach the window piece 605 to the window frame 600 is that it can reduce the need for polishing the window piece 605 after it is installed. According to one aspect of the invention, the mold can be formed with extremely smooth surfaces so that very little or no surface polishing is necessary after the molding process. It is also contemplated that the process for attaching molded transparent material to a window frame 500 can be performed using a batch process. According to this process, a set of window frames are placed within a single mold having a plurality of corresponding cavities. By using this process, a plurality transparent pieces 605 can be molded onto a plurality of corresponding window frames 500. A representative set of window frames 900 suitable for use with this process is depicted in FIG. 9. In FIG. 9, a plurality of window frames 905 are interconnected to form a set of window frames 900 that facilitates batch processing of the individual frames 905. For purposes of brevity and clarity, the window frames 905 depicted in FIG. 9 are planar and do not include the step or contour that is illustrated in FIG. 5. For these same reasons, the jigsaw pattern 520 on the inside edge of each of the frames 905 is not depicted. It is contemplated, however, that window frames that include contours and jigsaw portions are suitable for use with batch processing.

Figure 10:
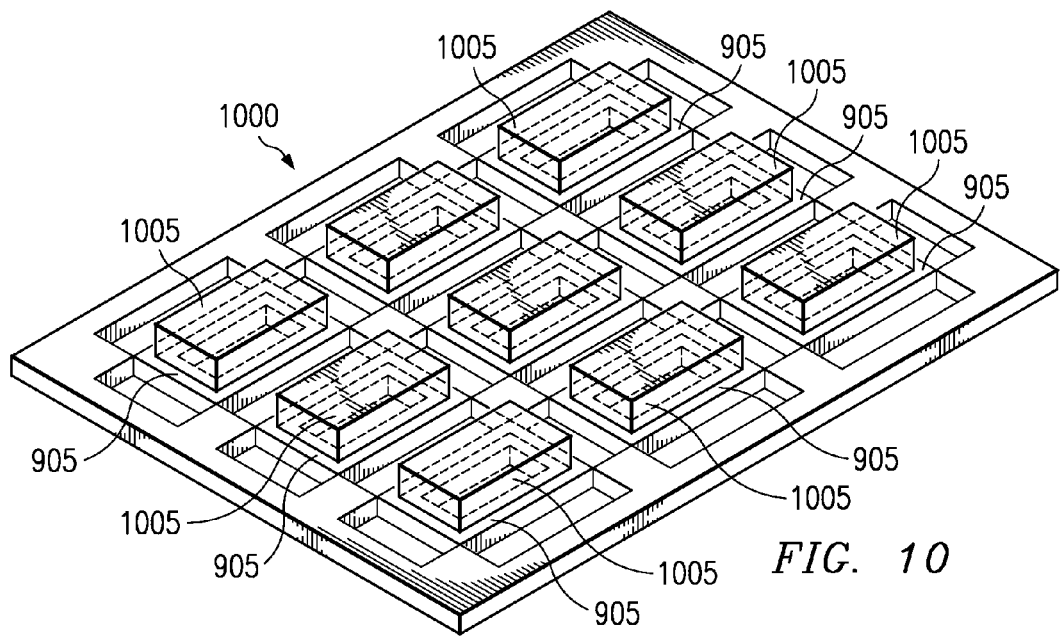
FIG. 10 is a perspective view of a representative set of window frames on which window pieces have been molded.

To attach window pieces to the set of window frames 900, the entire set 900 of frames is loaded into a batch mold and the transparent substance is flowed into the appropriate cavities. In this manner, several window frame/window piece assemblies can be fabricated at the same time. A set of window frames onto which corresponding window pieces 1005 have been molded is depicted in FIG. 10. After the window pieces 1005 have been molded to the corresponding window frames 905 in FIG. 10, the window frame/window piece assemblies can be removed from the set 1000 so that they can be mounted on an individual SLM device.

Although certain embodiments and aspects of the present inventions have been illustrated in the accompanying drawings and described in the foregoing detailed description, it will be understood that the inventions are not limited to the embodiments disclosed, but are capable of numerous rearrangements, modifications and substitutions without departing from the spirit of the invention as set forth and defined by the following claims and equivalents thereof. Applicant intends that the claims shall not invoke the application of 35 U.S.C. § 112, ¶ 6 unless the claim is explicitly written in means-plus-function or step-plus-function format.

We claim:

1. A window for a device package comprising:
   a frame comprising an inner portion and an outer portion, and having a first side and a second opposing side;
   a transparent piece attached to said inner portion of said frame and overlapping said first side and said second side of said frame.

2. The window of claim 1, wherein said frame comprises an alloy of iron, nickel, and cobalt.

3. The window of claim 1, wherein said frame comprises an alloy of iron.

4. The window of claim 1, wherein said frame comprises an alloy of nickel.

5. The window of claim 1, wherein said frame comprises an alloy of cobalt.

6. The window of claim 1, wherein said frame comprises a nickel plating.

7. The window of claim 1, wherein said frame comprises a gold plating.

8. The window of claim 1, wherein said frame comprises a gold plating over a nickel plating.

9. The window of claim 1, wherein said frame comprises a gold plating at least 50 microinches thick over a nickel plating between 100 and 300 microinches thick.

10. The window of claim 1, wherein said frame comprises a material compliant with a standard selected from the group consisting of: ASTM F-15 Mil-I-23011C Class 1, ASTM F-1684 (96) Mil-I-23011C Class 7, ASTM F-30 Mil-I-23011C Class 2, ASTM F-30 Mil-I-23011C Class 3, ASTM F-30 Mil-I-23011C Class 4, and ASTM F-30 Mil-I-23011C Class 5.

11. The window of claim 1, wherein said transparent piece comprises an alkali borosilicate glass.

12. The window of claim 1, wherein said transparent piece comprises an antireflective coating.

13. The window of claim 1, wherein said transparent piece comprises a chrome coating.

14. The window of claim 1, wherein said transparent piece is attached to said frame forming a seal having a leakage of less than $5 \times 10^{-8}$ cc/sec of helium.

15. The window of claim 1, wherein said transparent piece is attached to said frame forming a seal having a leakage of less than $5 \times 10^{-8}$ cc/sec of helium after 15 thermal shocks with $-55°$ C. to $+125°$ C. temperature extremes per MIL-STD-750D method 1056.7 test condition C.

16. The window of claim 1, wherein said transparent piece is attached to said frame forming a seal having a leakage of less than $5 \times 10^{-8}$ cc/sec of helium after 100 thermal cycles with $-55°$ C. to $+125°$ C. temperature extremes of MIL-STD-750D method 1056.7 test condition B.

17. The window of claim 1, wherein said transparent piece is attached to said frame forming a seal having a leakage of less than $5 \times 10^{-8}$ cc/sec of helium after 15 thermal shocks with $-55°$ C. to $+125°$ C. temperature extremes per MIL-STD-750D method 1056.7 test condition C and 100 thermal cycles with $-55°$ C. to $+125°$ C. temperature extremes per MIL-STD-750D method 1056.7 test condition B.

18. The window of claim 1, wherein said transparent piece is attached to said frame by molding said transparent piece over said frame.

* * * * *